(12) United States Patent
Fukuo et al.

(10) Patent No.: US 8,541,978 B2
(45) Date of Patent: Sep. 24, 2013

(54) FEED CONTROL DEVICE

(75) Inventors: Naoki Fukuo, Tsu (JP); Tatsuya Mukai, Tsu (JP); Shiro Mori, Tsu (JP); Hirotoshi Watanabe, Tsu (JP); Shinichi Nakamura, Tsu (JP); Kouji Kakiuchi, Tsu (JP); Yoji Minami, Nagoya (JP); Kazuhiro Kondou, Aichi-gun (JP); Kiyosi Gotou, Amagasaki (JP)

(73) Assignees: Panasonic Corporation, Kadoma-shi (JP); Toyoya Jidosha Kabushiki Kaisha, Toyota-shi (JP)

( * ) Notice: Subject to any disclaimer, the term of this patent is extended or adjusted under 35 U.S.C. 154(b) by 445 days.

(21) Appl. No.: 12/946,933

(22) Filed: Nov. 16, 2010

(65) Prior Publication Data
US 2011/0121780 A1 May 26, 2011

(30) Foreign Application Priority Data
Nov. 20, 2009 (JP) .................. 2009-264920

(51) Int. Cl.
*H02J 7/00* (2006.01)
(52) U.S. Cl.
USPC .............. 320/109; 361/42; 361/160; 320/115
(58) Field of Classification Search
USPC ................................ 320/109, 115
See application file for complete search history.

(56) References Cited

U.S. PATENT DOCUMENTS

| | | | | |
|---|---|---|---|---|
| 5,202,617 A | * | 4/1993 | Nor | 320/130 |
| 5,504,414 A | * | 4/1996 | Kinoshita | 180/65.8 |
| 7,292,418 B2 | * | 11/2007 | Egner | 361/42 |
| 7,595,607 B2 | * | 9/2009 | Lambert et al. | 320/106 |
| 8,363,364 B2 | * | 1/2013 | Watanabe et al. | 361/46 |
| 2007/0139005 A1 | | 6/2007 | Osawa | |
| 2010/0033140 A1 | | 2/2010 | Otake | |
| 2010/0194354 A1 | | 8/2010 | Gotou et al. | |

FOREIGN PATENT DOCUMENTS

| | | |
|---|---|---|
| JP | 2007-165253 A | 6/2007 |
| JP | 2008-312380 A | 12/2008 |
| JP | 2009-32413 A | 2/2009 |
| JP | 2009-33790 A | 2/2009 |
| JP | 2009-136110 A | 6/2009 |
| JP | 2009-240053 A | 10/2009 |

OTHER PUBLICATIONS

Notification of Reasons for Refusal for the Application No. 2009-264920 from Japan Patent Office mailed Oct. 25, 2011.

* cited by examiner

*Primary Examiner* — Samuel Berhanu
(74) *Attorney, Agent, or Firm* — Marvin A. Motsenbocker; Mots Law, PLLC

(57) ABSTRACT

A feed control device includes a contact device, an output detector, a contact weld sensor, and an alarm device. The output detector is configured to detect the presence of power feeding into the side of an electrically-powered car from an external power supply. The contact weld sensor is configured to sense that the contact device is welded based on a detection result of the output detector if detecting the presence of power feeding from the external power supply to a feed line for the contact device when a state signal representing charge permission is not entered. The alarm device is configured, if the contact weld sensor senses that the contact device is welded, to indicate the occurrence of weld to the outside.

5 Claims, 7 Drawing Sheets

FEED CONTROL DEVICE

TECHNICAL FIELD

The invention relates generally to feed control devices and, more particularly, to a feed control device connected between an external power supply and a vehicle.

BACKGROUND ART

Figure 1:
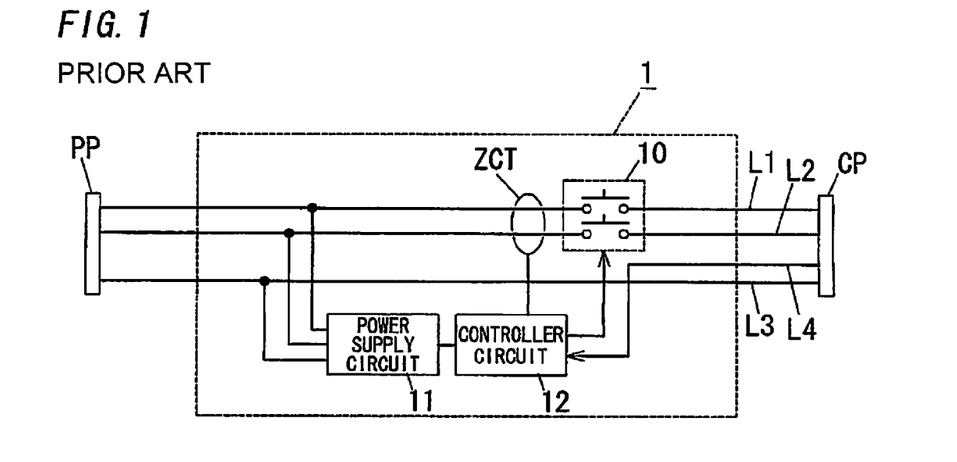
FIG. 1 is an internal circuit diagram of a prior art.

FIG. 1 depicts a prior art—a feed control device described in Japanese Patent Application Publication No. 2009-240053. The device is connected, through a cable, with a power supply side plug (PP) which can be connected to an external power supply such as, for example, a commercial AC (alternate current) power supply. The device is also connected, through a cable, with a vehicle side plug (CP) which can be connected to a vehicle (e.g., an electrically-powered car). The device is configured to control power feeding from the external power supply to the electrically-powered car. This feed control device is used to turn on and off the power to a charge circuit configured to charge a battery, which a vehicle such as a battery car or a plug-in hybrid car is equipped with.

In this sort of feed control device, when the battery of an electrically-powered car is charged, there is a problem causing electrical leakage from the high-tension side of the device to the car body. Accordingly, a feed line inside the device is provided with a relay for electrically connecting a power supply side plug and a vehicle side plug. The relay is configured, if the electrical leakage is detected, to open contacts of the replay to shut off the power to the electrically-powered car.

Returning to FIG. 1, the device includes, between the power supply and the electrically-powered car, a first electrically-conducting path (L1) corresponding to a live (hot) wire, a second electrically-conducting path (L2) corresponding to a neutral wire and a third electrically-conducting path (L3) corresponding to a ground wire. The device also includes a relay (10), a controller circuit (12), a power supply circuit (11) and a zero phase current transformer (ZCT). The relay (10) is inserted into the paths (L1 and L2) and is used to turn on and off the power to the electrically-powered car from the power supply. The control circuit (12) is connected to the electrically-powered car through fourth electrically-conducting path (L4) as a signal wire, and is configured to turn the relay (10) on and off in accordance with a control signal obtained from the electrically-powered car through the signal wire (L4). The power supply circuit (11) is connected to the paths (L1 and L2) between the power supply side plug (PP) and the relay (10) as well as the path (L3), and is configured to produce electric power supplied to the controller circuit (12) and so on. The paths (L1 and L2) between the power supply side plug (PP) and the relay (10) are inserted into a zero phase current transformer (ZCT). The transformer (ZCT) is configured, if unbalance occurs in electric currents flowing through the paths (L1 and L2), to generated an induced current according to an unbalance current between the paths (L1 and L2).

If the controller circuit (12) detects electrical leakage based on an induced current obtained from the zero phase current transformer (ZCT), the circuit (12) turns off the relay (10) to shut off the power to the electrically-powered car side. Therefore, the controller circuit (12) and the relay (10) function as an earth leakage breaker.

When the vehicle side plug (CP) is connected to the electrically-powered car with the power supply side plug (PP) connected to the external power supply, it is undesirable that voltage is output to the plug (CP). Accordingly, the controller circuit (12) keeps the relay (10) off until a charging start command is entered into the circuit (12) from the charge circuit side of the electrically-powered car after the plugs (PP) and (CP) are connected to the external power supply and the electrically-powered car, respectively.

In the feed control device, voltage may be output from the vehicle side plug (CP) just as the power supply side plug (PP) is connected to an external power supply in case contacts of the relay (10) are welded (stuck) together by arc generated when the relay (10) is turned on and off.

DISCLOSURE OF THE INVENTION

It is an object of the present invention to sense and show welded (stuck) contacts in a contact device to improve safeness.

A feed control device is configured to control power feeding from an external power supply to an electrically-powered car comprising a battery and a charge circuit configured to charge the battery. The feed control device comprises a power connector, a load connector, a contact device, a leak detector, a signal input circuit, a controller, a feed detector, an output detector, a contact weld sensor, and an alarm device. The power connector is configured to be detachably attached to a power receptacle of an external power supply. The load connector is configured to be detachably attached to a connector for receiving power, which an electrically-powered car is equipped with. The contact device is placed at a feed line for electrically connecting the power connector and the load connector. The leak detector is configured to detect the occurrence of electrical leakage at the side of the electrically-powered car. The signal input circuit is configured to receive, from the side of the charge circuit, a state signal representing an operating state by a voltage level. The controller is configured: to turn the contact device off when a state signal representing charge permission is not entered into the signal input circuit; to turn the contact device on when the state signal representing charge permission is entered into the signal input circuit; and to turn the contact device off when said occurrence of electrical leakage is detected. The feed detector is configured to detect the presence of power feeding from the external power supply by detecting zero crossing of voltage generated at the feed line between the power connector and the contact device. The output detector is configured to detect the presence of power feeding into the side of the car based on voltage generated at the feed line between the contact device and the load connector. The contact weld sensor is configured to sense that the contact device is welded based on a detection result of the output detector if the feed detector detects said presence of power feeding when the state signal representing charge permission is not entered into the signal input circuit. The alarm device is configured, if the contact weld sensor senses that the contact device is welded, to indicate the occurrence of weld to the outside.

In the invention, when power feeding into the side of an electrically-powered car is not started, the feed detector detects the presence of power feeding from the external power supply and the output detector subsequently detects voltage generated at the feed line between the contact device and the load connector. Based on the result, it is decided whether or not the contact device is welded. When the contact device is welded, the alarm performs the operation indicating thereof. Accordingly, it is possible to indicate, to a user, that the contact device is welded, thereby improving safeness.

In an embodiment, the controller is configured, if the signal input circuit receives the state signal representing charge permission: to turn the contact device off for a predetermined time; to subsequently sense whether or not the contact device is welded through the contact weld sensor; and to turn the contact device on if the contact device is not welded. In this embodiment, if a state signal representing charge permission is entered, the contact device is turned off for the predetermined time and subsequently it is sensed whether or not the contact device is welded. If the contact device is not welded, the contact device is turned on. Accordingly, even if charging is performed by detaching and attaching the only load connector from and to the connect of the electrically-powered car with the power connector connected to a power receptacle, welding check is first performed before the recharging. Accordingly, charging can be prevented from starting again without notifying a user that the contact device is welded.

In an embodiment, the output detector is configured to periodically detect the presence of power feeding while the controller turns the contact device on in accordance with the state signal representing charge permission. The feed control device further comprises a malfunction detector configured to detect operation malfunction of the contact device if said presence of power feeding is not detected through the output detector. The alarm device is configured, if the malfunction detector detects the operation malfunction, to indicate the occurrence of the operation malfunction of the contact device to the outside. In this embodiment, it is possible to detect operation malfunction of the contact device during charging to inform a user accordingly.

In an embodiment, the feed control device further comprises an signal output circuit, a photo-MOS relay and a relay controller. The signal output circuit is configured to supply the side of the charge circuit in the electrically-powered car with a state signal from the controller. The state signal represents an operating state by a voltage level. The photo-MOS relay is connected between the signal output circuit and the load connector. The relay controller is configured to turn the photo-MOS relay off until the voltage level of a state signal supplied from the signal output circuit becomes stable. In this embodiment, the photo-MOS relay is turned off for a time period during which the voltage level of a state signal from the signal output circuit is unstable. Thereby, an unstable state signal can be prevented from being transmitted to the side of the electrically-powered car. A stable signal can be transmitted and received between the feed control device and the car.

In an embodiment, the contact weld sensor is configured to sense that the contact device is welded if the output detector detects the presence of power feeding, after the controller turns the contact device off in accordance with the state signal. In this embodiment, even when the controller stops the power feeding, the contact weld sensor senses whether or not the contact device is welded. Therefore, a user can be notified that power feeding cannot be stopped owing to the occurrence of welded contacts in the contact device. The safeness can be further improved.

BRIEF DESCRIPTION OF THE DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION

First Embodiment

A first embodiment of the present invention is explained with reference to FIGS. 2-6. A feed control device of the present invention may include a contact device (e.g., a relay), a controller, an alarm device, and an output detector (e.g., a live voltage detector and/or a neutral voltage detector). The feed control device may also include, for example, all or part of a power connector, a load connector, a leak detector, a signal input circuit, a feed detector and a contact weld sensor. A feed control device (1) in the embodiment is connected, through a cable (PC), with a power supply side plug (PP) (as a power connector) which can be detachably connected to a power receptacle as an external power supply such as, for example, a commercial AC power supply. The device (1) is also connected, through a cable (CC), with a vehicle side plug (CP) (as a load connector) which can be detachably connected to the side of an externally charged battery of a vehicle such as an electrically-powered car (100). The device (1) is configured to control power feeding from the external power supply to the car (100). This feed control device (1) is used to turn on and off the power to a charge circuit (103) configured to charge a battery (102), which an electrically-powered car such as a battery car or a plug-in hybrid car is equipped with.

Figure 2:
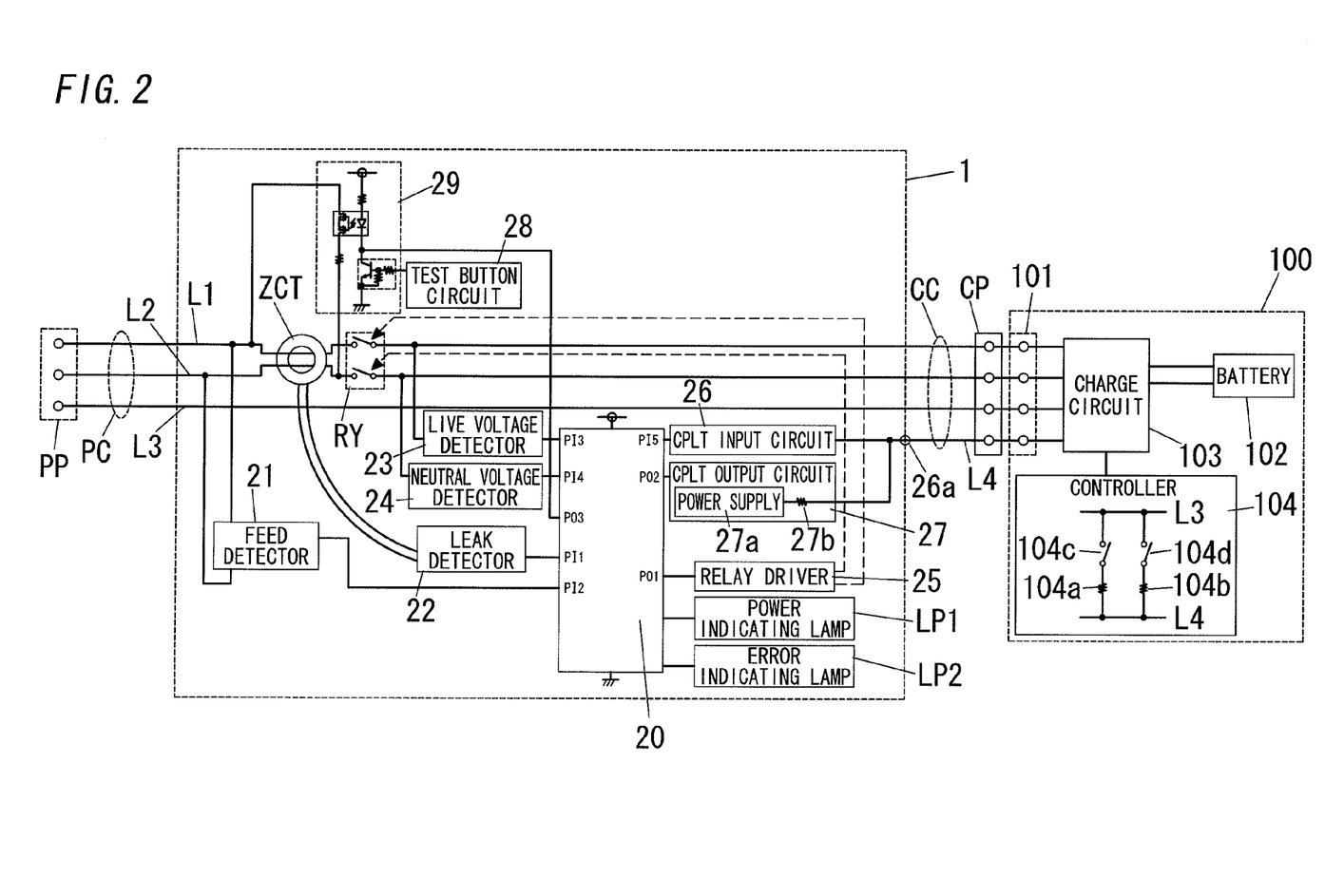
FIG. 2 is an internal circuit diagram of a first embodiment of the present invention.

The electrically-powered car (100) includes a connector (101), a battery (102) and a charge circuit (103). The connector (101) can be detachably connected with the vehicle side plug (CP). The battery (102) is, for example, a lithium-ion battery. The charge circuit (103) is configured to receive electric power from the external power supply via the connector (101) and the feed control device (1) to charge the battery (102).

As shown in FIGS. 4A-4C and 5, the feed control device (1) has a housing (2) in the shape of a long thin rectangular parallelepiped. The housing (2) is formed of a body (2a) and a cover (2b). The body (2a) is a molded component which is in the shape of a box with an opening such as a aperture plane and is made of synthetic resin. The cover (2b) is a molded component which is in the shape of a plate and is made of synthetic resin, and is used to close the opening of the body (2a). The body (2a) and the cover (2b) are fixed together with fixation screws (5) to constitute the housing (2). A support (3) is stuck out of a first lateral face in the longer direction of the body (2a), and is provided with a circular hook hole (3a). Accordingly, the housing (2) can be hung on a wall or the like by inserting a hook or the like on the wall into the hook hole (3a). In the embodiment, the cable (PC) is inserted into the housing (2) from the first lateral face of the housing (2), while the cable (CC) is inserted into the housing (2) from a second lateral face in the longer direction of the housing (2).

Figure 3:
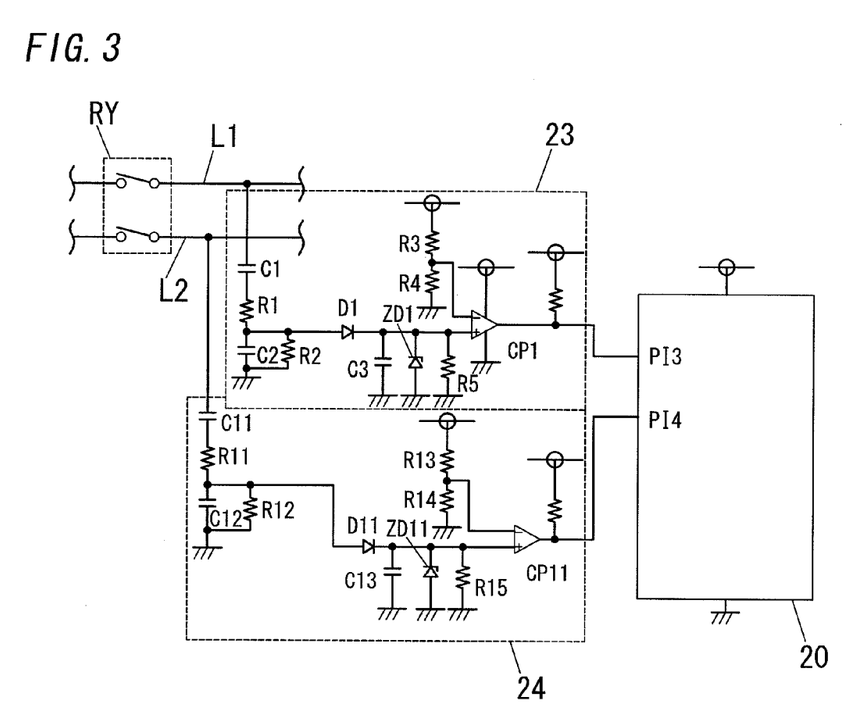
FIG. 3 illustrates an essential part of the circuit diagram.
Figures 4A, 4B:
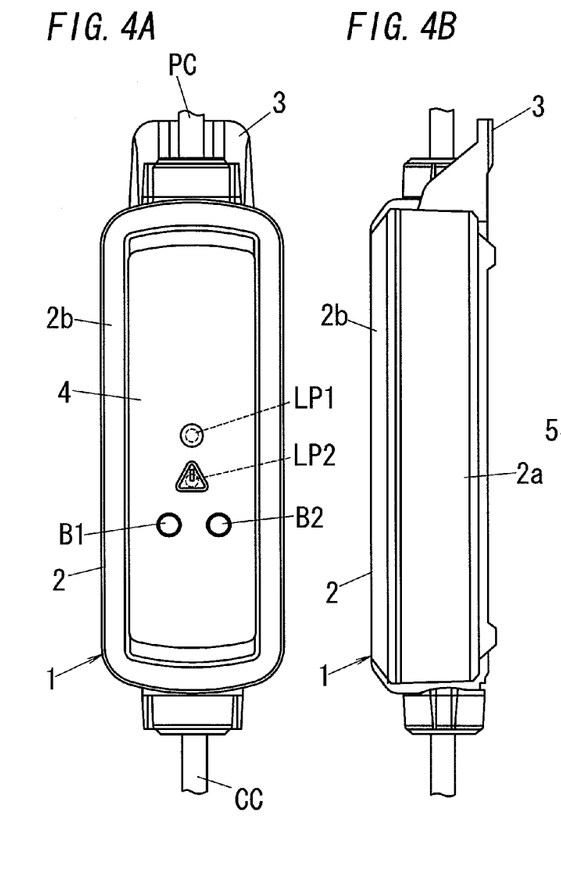
FIGS. 4A, 4B and 4C illustrate a front view, a right side view and a back view of the embodiment, respectively.
Figure 4C:
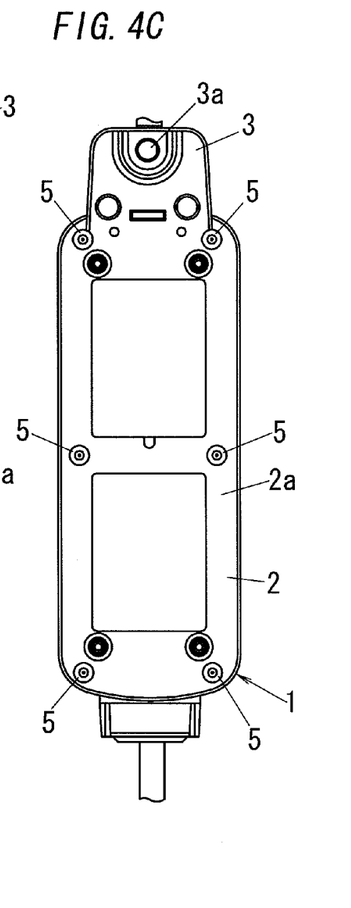
Figure 5:
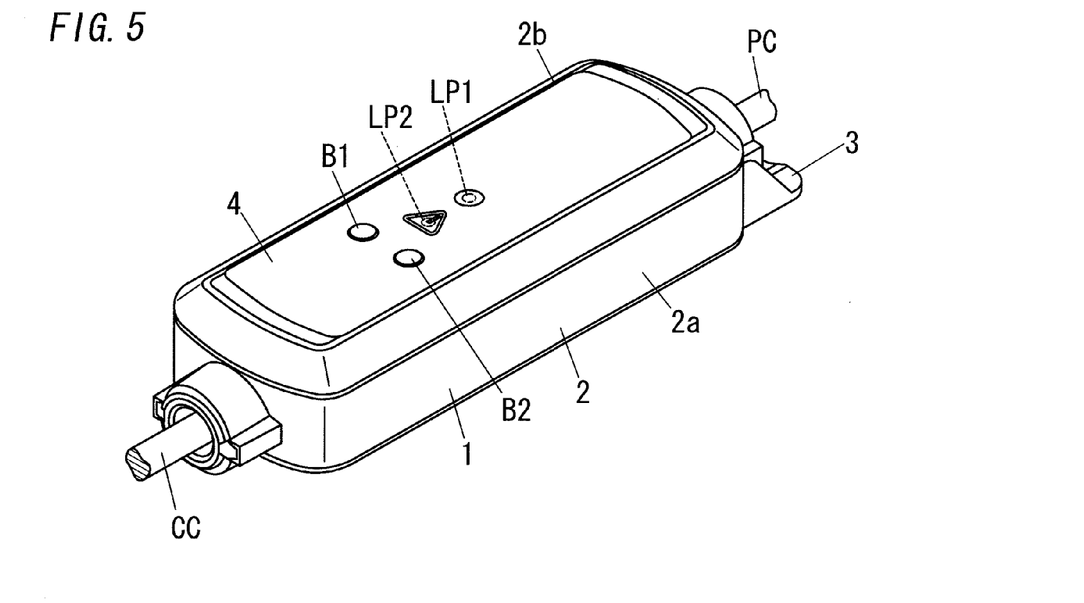
FIG. 5 illustrates a perspective view of the embodiment.

A printed-circuit board (not shown) on which an internal circuit shown in FIGS. 2 and 3 is mounted is put in the housing (2). A test button (B1) and a reset button (B2) are put side-by-side on the front of the housing (2) so that they can be operated from the outside of the housing (2). The test button (B1) is used to check the operation as a leakage breaker. The reset button (B2) is used to carry out a reset operation for resetting the cut-off status of a relay (RY). A power indicating lamp (LP1) and an error indicating lamp (LP2) are also placed on the front of the housing (2) so that light emitting of each of the lamps is visible from the outside. The power indicating lamp (LP1) is lit when power is fed into the feed control device (1) from an external power supply. The error indicating lamp (LP2) is lit when it is sensed that the relay (RY) is welded (specifically, when it is sensed that contacts in the relay (RY) are welded together), and is used as an alarm device. However, not limited to the lamp (LP2), the alarm device of the present invention may be, for example, a buzzer or the like. A resin label (4) having translucency and flexibility is stuck on the front of the housing (2) to cover the buttons (B1 and B2) and the lamps (LP1 and LP2). The label (4) is printed with characters or symbols which represent application or the like corresponding to each of the buttons (B1 and B2) and the lamps (LP1 and LP2).

FIG. 2 shows a circuit configuration of the feed control device (1). The device (1) includes, between an external power supply and an electrically-powered car (100), a first electrically-conducting path (conductor line) (L1) corresponding to a live wire (L phase), a second electrically-conducting path (L2) corresponding to a neutral wire (N phase) and a third electrically-conducting path (L3) corresponding to a ground wire.

The feed control device (1) includes the relay (RY) as a contact device, a controller (20), a feed detector (21), a zero phase current transformer (ZCT), a leak detector (22), a live voltage detector (23), a neutral voltage detector (24), a relay driver (25), a CPLT input circuit (26), a CPLT output circuit (27), a test button circuit (28) and a quasi-leakage circuit (29). The CPLT input circuit (26) and the CPLT output circuit (27) are provided as an example of the connection sensor of the present invention. However, not limited to this, the connection sensor of the present invention may be a tactile switch (a micro switch) that is turned on when the vehicle side plug (CP) is electrically connected with the charge circuit (103). The relay (RY) includes a first contact (two contacts made of metal or alloy in FIG. 2) electrically connected with the power supply side plug (PP) and a second contact (two contacts made of metal or alloy in FIG. 2) electrically connected with the vehicle side plug (CP). For example, the relay (RY) is a normally open relay inserted into the paths (L1 and L2), and is used to turn on and off the power to the plug (CP) from the plug (PP). However, not limited to this, the contact device of the present invention may be a (e.g., normally open) relay which is inserted into a path (L1 or L2) to turn on and off the power to the plug (CP) from the plug (PP).

The controller (20) includes a microcomputer configured to perform overall control of the feed control device (1). For example, the controller (20) is configured to control the relay (RY) to make or break a connection between the first and second contacts. The feed detector (21) is configured to detect the presence of power feeding, namely the presence of power fed from an external power supply to the power supply side plug (PP) by detecting zero crossing of voltage generated across the paths (L1 and L2) as a feed line between the plug (PP) and the relay (RY). The zero phase current transformer (ZCT) has a core into which the paths (L1 and L2) are inserted, and is configured, if unbalance occurs in electric currents flowing through the paths (L1 and L2), to generated an electric current according to its unbalance current at the secondary side. The leak detector (22) is configured to detect the occurrence of electrical leakage based on the secondary output of the transformer (ZCT).

The live voltage detector (23) is configured to detect voltage generated at the path (L1) between the relay (RY) and the vehicle side plug (CP). The neutral voltage detector (24) is configured to detect voltage generated at the path (L2) between the relay (RY) and the vehicle side plug (CP). These detectors constitute an output detector for detecting a connection between the first and second contacts, and is configured to detect the presence of power feeding, from an external power supply connected to the plug (PP), caused by the connection between the first and second contacts. However, not limited to this, the present invention may further include a power supply (not shown) configured to supply an electric signal to at least a first contact, and the output detector of the present invention may be configured to detect the connection between the first and second contacts if a signal corresponding to the electric signal from the power supply is obtained through the (corresponding) second contact. In an example, the power supply includes a battery and a converter configured to convert voltage from the plug (PP) into DC voltage to supply the DC voltage to the battery, and is configured to supply the voltage of the battery to the first contact.

The relay driver (25) is configured to turn the relay (RY) on or off in accordance with a close control signal or an open control signal from a first output terminal (PO1) for relay drive of the controller (20).

The CPLT input circuit (26) as a signal input circuit is connected to an electrically-powered car (100) through fourth electrically-conducting path (L4) as a signal wire, and is configured to supply a fifth input terminal (PI5) for CPLT of the controller (20) with a state signal obtained from the car (100) through the path (L4). The state signal is what is called a CPLT signal. For example, the circuit (26) includes a signal input terminal (26a) that is electrically connected with a resistor provided for the charge circuit (103) side when the vehicle side plug (CP) is electrically connected with the circuit (103). Specifically, the car (100) has a controller (104) for the charge circuit (103), and the controller (104) includes, for example, first and second resistors (104a and 104b). The first and second resistors (104a and 104b) are connected between the paths (L3 and L4) through first and second switch devices (104c and 104d), respectively and the first and second switch devices (104c and 104d) are turned on and off through a CPU (not shown) in the controller (104).

The CPLT output circuit (27) as an signal output circuit is configured to supply the electrically-powered car (100) with a state signal from a second output terminal (PO2) for CPLT of the controller (20) by changing the voltage level of the path (L4). For example, the circuit (27) includes a voltage supply (27a) configured to generate first specified voltage (e.g., 12V) and second specified voltage (e.g., −12V) and a resistor (27b) connected between the output of the voltage supply (27a) and the signal input terminal (26a). However, not limited to this, the voltage supply of the signal output circuit in the present invention may be configured to generate only first specified voltage (e.g., 12V).

The test button circuit (28) is configured to generate a test signal in accordance with the test button (B1) operation for checking the operation as a leakage breaker. The quasi-leakage circuit (29) is configured to generate quasi-leakage between the paths (L1 and L2) if a test signal is entered through the test button circuit (28) or the voltage level of a third output terminal (PO3) for leakage of the controller (20) becomes an L-level. The feed control device (1) also includes a power supply circuit (not shown) that is connected with the paths (L1-L3) between the power supply side plug (PP) and the relay (RY) and configured to produce operating power for the aforementioned components (20-29).

The voltage level of the state signal (CPLT signal) is changed by changing the resistance value in the controller (104) provided for the charge circuit (103) in the electrically-powered car (100). By the state signal, the operating condition is transmitted to the feed control device (1). An example of the voltage levels is shown in table 1.

TABLE 1

| CPLT SIGANL | STATE |
|---|---|
| 12 V | NON-CONNECTION WITH CAR |
| 9 V | CHARGE READY |
| 6 V | CHARGE PERMISSION |
| 0 V | POWER NOT AVAILABLE |
| −12 V | ERROR OCCURRENCE |

If the voltage level of the state signal is 12'V (first specified voltage), it is shown that no electrically-powered car is connected (non-connection with car). If the level is 9V (one of the first and second switch devices (104c and 104d) is turned on), the state of charge ready is shown (i.e., it is shown that power feeding into an electrically-powered car is stopped). If the level is 6V (the other of the first and second switch devices (104c and 104d) is turned on), the state of charge permission is shown (i.e., it is shown that power can be fed into an electrically-powered car). If the level is 0V, it is shown that power is not available. In the feed control device (1), if the voltage level of the state signal is changed to −12V (second specified voltage), an electrically-powered car is notified of the occurrence of operation malfunction (failure) in the device (1) (error occurrence).

FIG. 3 depicts concrete circuits of the live voltage detector (23) and the neutral voltage detector (24). The live voltage detector (23) includes condensers (C1-C3), resistors (R1-R5), a diode (D1), a zener diode (ZD1) and a comparator (CP1). The condenser (C1), the resistor (R1) and the condenser (C2) constitute a series circuit that is connected between the paths (L1 and L3). The resistor (R2) is connected in parallel with the condenser (C2). The condenser (C3) is connected between both ends of the condenser (C2) through the diode (D1). Each of the zener diode (ZD1) and the resistor (R5) is connected in parallel with the condenser (C3). The resistors (R3 and R4) obtain reference voltage by dividing supply voltage having a predetermined voltage value. The comparator (CP1) is configured to detect the presence of power feeding into the path (L1) between the relay (RY) and the vehicle side plug (CP) by comparing the reference voltage and the voltage across the condenser (C3) about high and low. The output of the comparator (CP1) is entered into a third input terminal (PI3) of the controller (20). Specifically, an external power supply as a commercial AC power supply is connected to the power supply side plug (PP). In this instance, when the relay (RY) is turned on, the condenser (C3) is charged through the diode (D1) during each positive half cycle of voltage of the path (L1). If the voltage across the condenser (C3) exceeds the reference voltage obtained through the resistors (R3 and R4), the output of the comparator (CP1) is turned to an H (high) level from an L (low) level. During each negative half cycle of voltage of the path (L1), the electric charge of the condenser (C3) is discharged through the resistor (R5) and the voltage across the condenser (C3) is gradually decreased. However, each constant of the condenser (C3) and the resistor (R5) is so set that the voltage across the condenser (C3) does not meanwhile fall below the reference voltage. Accordingly, while the power supply side plug (PP) is connected to the power receptacle and the relay (RY) is turned on, the output of the comparator (CP1) remains an H-level.

The neutral voltage detector (24) includes condensers (C11-C13), resistors (R11-R15), a diode (D11), a zener diode (ZD11) and a comparator (CP11) like the live voltage detector (23). The condenser (C11), the resistor (R11) and the condenser (C12) constitute a series circuit that is connected between the paths (L2 and L3). The resistor (R12) is connected in parallel with the condenser (C12). The condenser (C13) is connected between both ends of the condenser (C12) through the diode (D11). Each of the zener diode (ZD11) and the resistor (R15) is connected in parallel with the condenser (C13). The resistors (R13 and R14) obtain reference voltage by dividing supply voltage having a predetermined voltage value. The comparator (CP11) is configured to detect the presence of power feeding into the path (L2) between the relay (RY) and the vehicle side plug (CP) by comparing the reference voltage and the voltage across the condenser (C13) about high and low. The output of the comparator (CP11) is entered into fourth input terminal (PI4) of the controller (20). Specifically, an external power supply as a commercial AC power supply is connected to the power supply side plug (PP).

In this instance, when the relay (RY) is turned on, the condenser (C13) is charged through the diode (D11) during each positive half cycle of voltage of the path (L2). If the voltage across the condenser (C13) exceeds the reference voltage obtained through the resistors (R13 and R14), the output of the comparator (CP11) is turned to an H-level from an L-level. During each negative half cycle of voltage of the path (L2), the electric charge of the condenser (C13) is discharged through the resistor (R15) and the voltage across the condenser (C13) is gradually decreased. However, each constant of the condenser (C13) and the resistor (R15) is so set that the voltage across the condenser (C13) does not meanwhile fall below the reference voltage. Accordingly, while the power supply side plug (PP) is connected to the power receptacle and the relay (RY) is turned on, the output of the comparator (CP11) remains an H-level.

According to an aspect of the invention, the controller (20) is configured to light (turn on) the error indicating lamp (LP2) if detecting a connection between the first and second contacts of the relay (RY) through the output detector when trying to break the connection between the first and second contacts. In the example of FIG. 2, the above connection to be detected comprises a connection between a pair (upper part) of a first contact and a second contact and a connection between another pair (lower part) of a first contact and a second contact. In the embodiment, the controller (20) is configured to light the lamp (LP2) if detecting a connection between the first and second contacts of the relay (RY) through the output detector when trying to break the connection between the first and second contacts without the connection sensor sensing a load connector. The load connection is a connection between the vehicle side plug (CP) and an electrically-powered car (100). Specifically, the controller (20) is configured to light the lamp (LP2) if detecting the connection between the first and second contacts of the relay (RY) through the output detector when trying to break the connection between the first and second contacts with voltage of the signal input terminal (26a) equal to the specified voltage (e.g., 12V).

The operation of the embodiment is now explained with reference to FIG. 6. If the power supply side plug (PP) is connected to the power receptacle, the commercial AC power supply is connected to the feed control device (1) and operating power is fed into the components (20-29) from the power supply circuit of the device (1). Thereby, the components (20-29) are activated.

The controller (20) is activated and then monitors each signal level of the input terminals (PI1-PI5). When the vehicle side plug (CP) is not connected to any electrically-powered car (100), the signal level of the input terminal (PI5), namely the signal level of a state signal is 12V and accordingly the relay (RY) is turned off.

The feed detector (21) is trying to detect the presence of power feeding by detecting zero crossing of the commercial AC power supply which is fed between the electrically-conducting path (L1) corresponding to a live wire and the electrically-conducting path (L2) corresponding to a neutral wire. If the presence of power feeding is detected, the detector (21) turns voltage level of the output signal from an L-level to an H-level.

Figure 6:
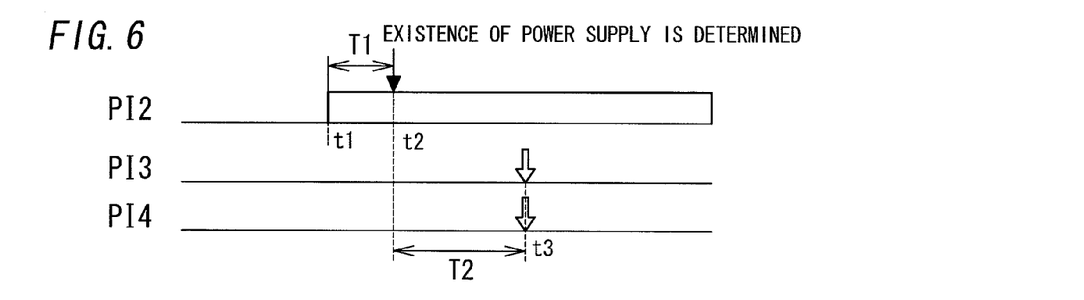
FIG. 6 is an operation timing chart of the embodiment, wherein PI2 is an input terminal of a controller and shows a detection signal from a feed detector, PI3 is an input terminal of the controller and shows a detection signal from a live voltage detector, and PI4 is an input terminal of the controller and shows a detection signal from a neutral voltage detector.

As shown in FIG. 6, an output signal of the feed detector (21) is entered into the input terminal (PI2), of which voltage level is turned to an H-level at a time point (t1). If the voltage level subsequently remains the H-level for a predetermined time period, the controller (20) decides the presence of power feeding and turn on the power indicating lamp (LP1). The controller (20) functions as a contact weld sensor and receives detection signals of the live voltage detector 23 and the neutral voltage detector 24 as the output detector from input terminals (PI3 and PI4) at a time point (t3) after the elapse of a predetermined circuit stability time (T2) from the time point (t2) when the presence of power feeding is decided. The controller (20) then decides if the relay (RY) is welded (i.e., contacts in the relay (RY) are welded together). That is, at the time point (t3), based on the output detector's high-low comparison result between each detection signal of the input terminals (PI3 and PI4) and a corresponding threshold (reference voltage), the controller (20) decides that the relay (RY) is not welded if each detection signal is equal to or less than a corresponding threshold. On the other hand, if at least one of the detection signals is greater than a corresponding threshold, the controller (20) decides that the relay (RY) is welded, because power is fed into the car (100) side regardless of trying to turn the relay (RY) off. In this instance, the controller (20) turns the error indicating lamp (LP2) on and also outputs a state signal representing error occurrence (−12V) through the CPLT output circuit (27). The circuit stability time (T2) corresponds to the time necessary for stable output of each of the live voltage detector (23) and the neutral voltage detector (24), and is set to, for example, approximately 75 milliseconds.

When the relay (RY) is not welded, if the vehicle side plug (CP) is connected to an electrically-powered car (100), a state signal representing charge ready (9V) is entered into the feed control device (1) from the controller (104) provided for the charge circuit (103) in the car (100). The controller (20) maintains the off-state of the relay (RY) in accordance with the state signal entered into the input terminal (PI5). If a state signal representing charge permission (6V) is entered into the device (1) from the controller (104) provided for the charge circuit (103) in the car (100), the controller (20) supplies the relay driver (25) with a close control signal for turning the relay (RY) on in accordance with the state signal entered into the input terminal (PI5). The driver (25) then turns the relay (RY) on. At this time, a commercial AC power supply is supplied to the charge circuit (103) of the car (100) through the feed control device (1), and the battery (102) is charged through the circuit (103). If charging of the battery (102) is completed, a state signal representing charge ready (9V) is entered into the device (1) from the charge circuit (103) side. The controller (20) supplies the relay driver (25) with an open control signal for turning the relay (RY) off in accordance with the state signal entered into the input terminal (PI5). The driver (25) turns off the relay (RY) to shut off the power fed into the car (100). When the relay (RY) is welded, even if the vehicle side plug (CP) is connected to an electrically-powered car (100), a state signal representing error occurrence is entered into controller (104) provided for the charge circuit (103) from the feed control device (1). Accordingly, the controller (104) provided for the charge circuit (103) can detect the failure of the device (1), and therefore does not start charging the battery (102).

If the leak detector (22) detects electrical leakage based on the output of the zero phase current transformer (ZCT) during charging, the detector (22) supplies a leakage detection signal to the input terminal (PI1) of the controller (20). In accordance with the leakage detection signal, the controller (20) supplies an open control signal to the relay driver (25) to turn the relay (RY) off through the driver (25), thereby shutting off the power fed into the electrically-powered car (100).

Thus, the feed control device (1) controls the power feeding into an electrically-powered car (100). The controller (20) of the device (1) decides whether or not contacts in the relay (RY) are welded together based on voltage detection result of each of the live voltage detector (23) and the neutral voltage detector (24) with reference to the feed line between the relay (RY) and the vehicle side plug (CP). The decision performed if the feed detector (21) detects the presence of power feeding from an external power supply, immediately after the power supply side plug (PP) is connected to a power receptacle, namely when power feeding into the car (100) side is not started. If the relay (RY) is welded, the error indicating lamp (LP2) is lit and also a state signal representing error occurrence is supplied to the car (100) side. Accordingly, it is possible to immediately notify a user that the relay (RY) is welded, and the safeness can be improved. If it is sensed that the relay (RY) is welded, the feed control device (1) supplies the electrically-powered car (100) with a state signal representing error occurrence. Accordingly, it is possible to notify the car (100) side of failure occurrence in the device (1). The controller (20) decides the presence of welded contacts based on detection result of each of the live voltage detector (23) and the neutral voltage detector (24) after the elapse of a circuit stability time (T2), necessary for stable output of each of the detectors (23 and 24) (output detector), from the time point when the presence of power feeding from the external power supply is detected. Accordingly, the false detection of welded contacts can be prevented.

Second Embodiment

A second embodiment of the present invention is explained with reference to FIG. 7. A feed control device (1) in the embodiment is configured like the first embodiment, and therefore like kind elements are assigned the same reference numerals as depicted in the first embodiment.

In the first embodiment, the feed control device (1) is configured to sense the presence of welded contacts in the relay (RY) immediately after the power supply side plug (PP) is connected to a power receptacle. Accordingly, in order to recharge the battery (102) of an electrically-powered car (100), if the only vehicle side plug (CP) is, without the plug (PP) pulled out of the receptacle, pulled out of the car (100) side and then pulled in the car (100) side, sensing of welded contacts is not performed.

Therefore, in the second embodiment, a controller (20) is configured to sense the presence of welded contacts again even if receiving a state signal representing charge permission from the charge circuit (103) side of an electrically-powered car (100).

Figure 7:
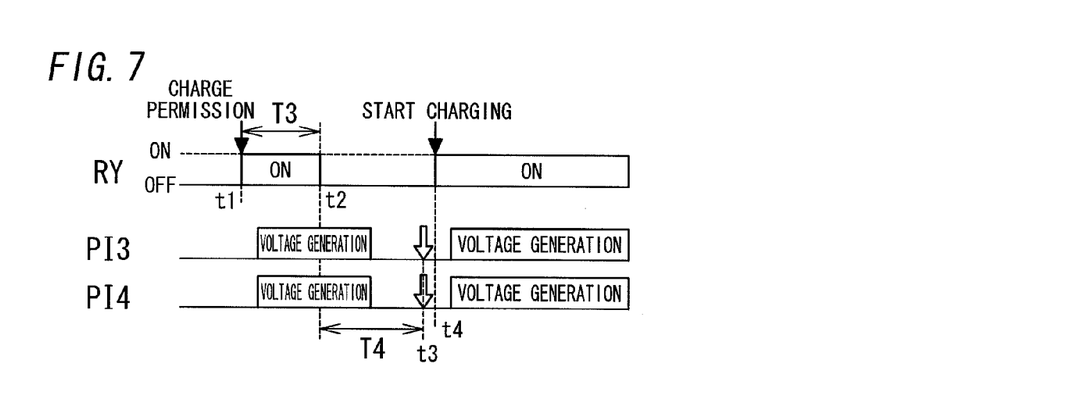
FIG. 7 is an operation timing chart of a second embodiment of the present invention, wherein RY shows on and off condition of a relay, PI3 is an input terminal of a controller and shows a detection signal from a live voltage detector, and PI4 is an input terminal of the controller and shows a detection signal from a neutral voltage detector.

FIG. 7 depicts a timing chart as an explanatory diagram of the operation. If a state signal representing charge permission is entered into the input terminal (PI5) of the controller (20) from the charge circuit (103) side at a point time (t1) with the power supply side plug (PP) connected to a power receptacle, the controller (20) supplies a close control signal to a relay driver (25) only for a predetermined time (T3). After the relay (RY) is turned on only for the predetermined time (T3), the controller (20) supplies an open control signal to relay driver (25) to turn the relay (RY) off. The controller (20) subsequently functions as a contact weld sensor and receives detection signals from the live voltage detector (23) and the neutral voltage detector (24) via the input terminals (PI3 and PI4) at a time point (t3) after the elapse of a predetermined time (T4) from the time point when the relay (RY) is turned off. The controller (20) then decides whether or not the relay (RY) is welded. That is, at the time point (t3), the controller (20) compares each detection signal of the input terminals (PI3 and PI 4) and a corresponding threshold about high and low. If each detection signal is equal to or less than a corresponding threshold, the controller (20) decides that the relay (RY) is not welded. The controller (20) subsequently supplies a close control signal to the relay driver (25) at a time point (t4) to turn the relay (RY) on again, thereby feeding power into the side of an electrically-powered car (100) to start charging the battery (102) through the charge circuit (103) of the car (100).

At the time point (t3), the controller (20) compares each detection signal of the input terminals (PI3 and PI 4) and a corresponding threshold about high and low, so that if at least one of the detection signals exceeds a corresponding threshold, the controller (20) decides that the relay (RY) is welded, because power is fed into the car (100) side regardless of trying to turn the relay (RY) off. The controller (20) turns the error indicating lamp (LP2) on and also outputs a state signal representing error occurrence (−12V) through the CPLT output circuit (27). Accordingly, it is possible to notify a user that the relay (RY) is welded, and the car (100) side can be notified of failure occurrence in the device (1).

The aforementioned time (T4) is a time that needs to reset detection output of each of the live voltage detector (23) and the neutral voltage detector (24). In the embodiment, the time (T4) corresponds to the time that needs to discharge each electric charge of the condensers (C3 and C13), and is set to, for example, approximately 400 milliseconds.

In the embodiment, if a state signal representing charge permission is entered into the input terminal (PI5) of the controller (20) via the CPLT input circuit (26), the controller (20) turns the relay (RY) on for a predetermined time. The controller (20) then turns the relay (RY) off and decides the presence of welded contacts based on detection output of each of the live voltage detector (23) and the neutral voltage detector (24) at the time point after the elapse of the predetermined time (T4) that needs to reset detection output of each of the detectors (23 and 24). If deciding that the relay (RY) is not welded, the controller (20) turns the relay (RY) on to start charging. If deciding that the relay (RY) is welded, the controller (20) turns the error indicating lamp (LP2) on and outputs a state signal representing error occurrence via the CPLT output circuit (27). Therefore, even if the only vehicle side plug (CP) is detached from and attached to the connector (101) of an electrically-powered car (100) with the power supply side plug (PP) connected to a power receptacle, the presence of welded contacts is first sensed before charging is performed again. Accordingly, charging can be prevented from starting again without notifying a user that the relay (RY) is welded. Before deciding the presence of welded contacts, the controller (20) turns the relay (RY) off for a predetermined time that needs to reset detection output of each of the live voltage detector (23) and the neutral voltage detector (24) (output detector). Accordingly, the electric charges of the condensers (C3 and C13) in the detectors (23 and 24) can be certainly discharged. The failure detection caused by residual voltage across each of the condensers (C3 and C13) can be avoided and the presence of welded contacts can be decided accurately.

Third Embodiment

A third embodiment of the present invention is explained with reference to FIG. 8. A feed control device (1) in the embodiment is configured like any of the first and second embodiments, and therefore like kind elements are assigned the same reference numerals as depicted in the embodiments.

In the first and second embodiments, each of the feed control devices (1) is configured to sense the presence of welded contacts before starting charging. In the present embodiment, a controller (20) is further configured, after starting charging, to decide whether or not the relay (RY)

works correctly based on detection signals of the live voltage detector (23) and the neutral voltage detector (24). The controller (20) is also configured, if deciding that the relay (RY) malfunctions, to indicate the status.

Figure 8:
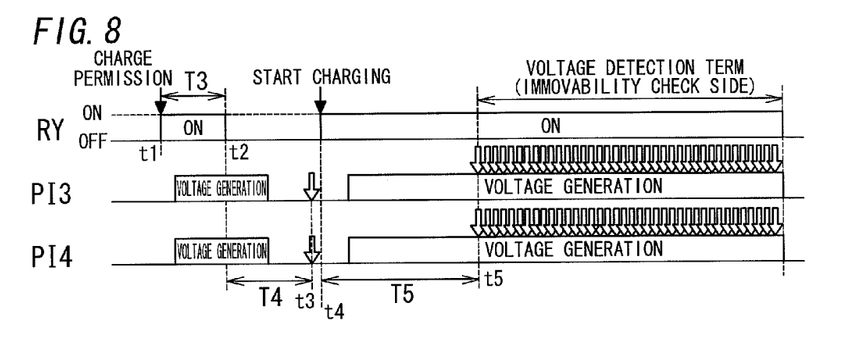
FIG. 8 is an operation timing chart of a third embodiment of the present invention, wherein RY shows on and off condition of a relay, PI3 is an input terminal of a controller and shows a detection signal from a live voltage detector, and PI4 is an input terminal of the controller and shows a detection signal from a neutral voltage detector.

FIG. 8 depicts a timing chart for explaining the operation of the embodiment. If a state signal representing charge permission is entered into the input terminal (PI5) from the charge circuit (103) at a time point (t1), the controller (20) supplies a close control signal to the relay driver (25) to turn the relay (RY) on only for a predetermined time (T3). The controller (20) subsequently supplies an open control signal to the relay driver (25) to turn the relay (RY) off. The controller (20) subsequently receives detection signals from the live voltage detector (23) and the neutral voltage detector (24) through the input terminals (PI3 and PI4), respectively at a time point (t3) after the elapse of a predetermined time (T4) from the time point (t2) when the relay (RY) is turned off (opened). The controller (20) then decides if the relay (RY) is welded. That is, at the time point (t3), the controller (20) compares each detection signal of the input terminals (PI3 and PI4) and a corresponding threshold about high and low. If each detection signal is equal to or lower than a corresponding threshold, the controller (20) decides that the relay (RY) is not welded. The controller (20) subsequently supplies a close control signal to the relay driver (25) at a time point (t4) to turn the relay (RY) on again, thereby feeding power into the side of an electrically-powered car (100) to start charging the battery (102) through the charge circuit (103) in the car (100).

During charging of the battery (102), the controller (20) functions as a malfunction detector, and successively receives the detection signals of the live voltage detector (23) and the neutral voltage detector (24) through the input terminals (PI3 and PI4), respectively from a time point (t5) after the elapse of a predetermined time (T5) from the time point (t4). The controller (20) then compares each of the detection signals and a corresponding threshold about high and low. If each of the detection signals exceeds a corresponding threshold, the controller (20) decides that the relay (RY) works correctly for power feeding. The controller (20) compares each of the detection signals and a corresponding threshold about high and low, so that if each of the detection signals is lower than a corresponding threshold, the controller (20) decides that the relay (RY) is not turned on and does not work correctly. The controller (20) then turns the error indicating lamp (LP2) on and also outputs a state signal representing error occurrence (−12V) through the CPLT output circuit (27).

The aforementioned time (T5) corresponds to the time required to stabilize the detection signals of the live voltage detector (23) and the neutral voltage detector (24), and is set to, for example, 2300 milliseconds.

As discussed above, the controller (20) of the feed control device (1) successively receives the detection signals of the live voltage detector (23) and the neutral voltage detector (24) while power is fed into the side of an electrically-powered car (100) and the battery (102) is charged. The controller (20) then detects whether or not power is correctly fed into the car (100) side. If power is not fed, the controller (20) decides that the relay (RY) malfunctions, and turns the error indicating lamp (LP2) on while outputting a state signal representing error occurrence (−12V) through the CPLT output circuit (27). Accordingly, it is possible to notify a user that the device (1) side malfunctions, and also notify the car (100) side of failure occurrence in the device (1). The embodiment may be applied to the feed control device (1) in the first embodiment so that during charging of an electrically-powered car (100) the controller (20) decides whether or not the relay (RY) works correctly based on the detection signals of the live voltage detector (23) and the neutral voltage detector (24).

Fourth Embodiment

A fourth embodiment of the present invention is explained with reference to FIGS. 9-11.

Figure 9:
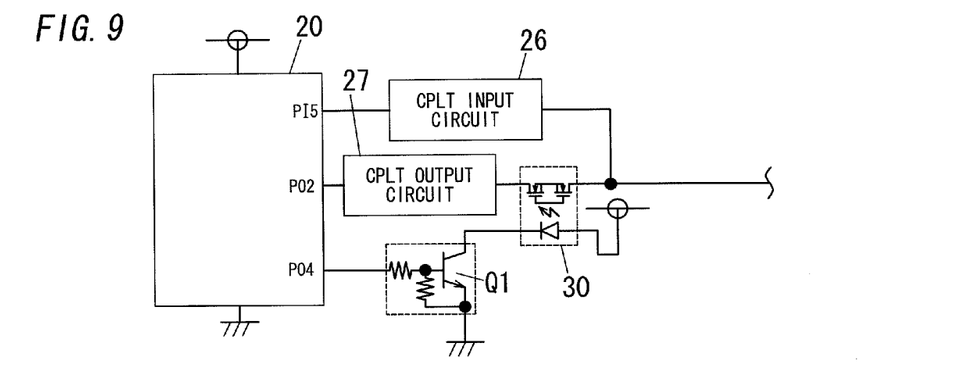
FIG. 9 illustrates an essential part of a fourth embodiment of the present invention.

FIG. 9 is a circuit diagram of an essential part of a feed control device (1) in the present embodiment. The feed control device (1) further includes a photo-MOS relay (30) and a switch device (Q1) in addition to a configuration like any feed control device (1) in the first to third embodiments. The photo-MOS relay (30) includes, at its own secondary side, a MOSFET connected between the CPLT output circuit (27) and the vehicle side plug (CP). The switch device (Q1) includes a transistor which is turned on and off in accordance with the output of the controller (20) and then turns on and off the power (electric current) to a diode included at the primary side of the photo-MOS relay (30). The embodiment is the same as any of the first to third embodiments except for the photo-MOS relay (30) and the switch device (Q1), and therefore like kind elements are assigned the same reference numerals as depicted in the embodiments and is not described in detail herein.

There is a possibility that the voltage level of an output signal from the CPLT output circuit (27) becomes unstable immediately after the power to the feed control device (1) is turned on or off. In the present embodiment, the controller (20) function as a relay controller and is configured to turn the switch device (Q1) on or off so as to turn off the MOSFET at the output side of the photo-MOS relay (30) for a constant time immediately after the power to the feed control device (1) is turned on and for a predetermined time immediately after the power to the device (1) is turned off. Thereby, it is possible to prevent output of an unstable CPLT signal to the side of an electrically-powered car (100). Incidentally, the photo-MOS relay (30) is turned off by turning the switch device (Q1) on if the relay (30) is a normally closed type, while the photo-MOS relay (30) is turned off by turning the switch device (Q1) off if the relay (30) is a normally opened type.

Figure 10:
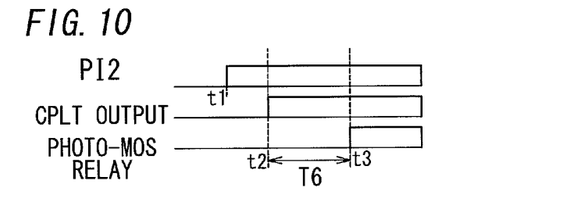
FIG. 10 is an operation timing chart of the embodiment, wherein PI2 is an input terminal of a controller and shows a detection signal from a feed detector, CPLT output shows a state signal (CPLT signal), and the photo-MOS relay shows its on and off condition.

FIG. 10 depicts a timing chart when power is activated. If the feed control device (1) is energized at a time point 40, power is fed into each of the components (20-29) and then each component is activated. During a certain period T6 (t2-t3) from the activation time point (t2) of the CPLT output circuit (27) immediately after the power is activated, the operation of the CPLT output circuit (27) may be unstable and also a CPLT signal as the output of the CPLT output circuit (27) may be unstable. Therefore, immediately after the power is activated, the controller (20) turns off the photo-MOS relay (30) to shut off the output of the CPLT output circuit (27) until a time point (t3) when the operation of the circuit (27) becomes stable. Thereby, it is possible to halt the communication between the circuit (27) and an electrically-powered car (100) during the transitional period that the output is unstable.

Figure 11:
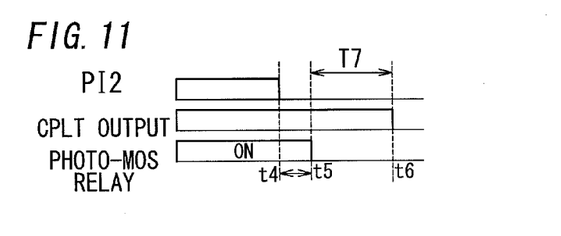
FIG. 11 is another operation timing chart of the embodiment, wherein PI2 is an input terminal of the controller and shows a detection signal from the feed detector, CPLT output shows a state signal (CPLT signal), and photo-MOS relay shows its on and off condition.

FIG. 11 depicts a timing chart when power is shut off. If the power fed into the feed control device (1) is shut off at a time point (t4), voltage fed into each of the components (20-29) from the power supply circuit decreases gradually and the components then stop their operations successively. However, the CPLT output circuit (27) may output a signal until a time point (t6) after the power is shut off at the time point (t4). Specifically, during a certain time (e.g., 50 milliseconds) after the power is shut off at the time point (t4), sufficient voltage is supplied to each of the components (20-29) from the power supply circuit and thereby each component can operate stably. However, the voltage of the power supply circuit decreases for a transitional period that is a time period (T7) from the time point (t5) after the elapse of the certain time to a time point (t6) when the output of the CPLT output circuit (27) is stopped. Accordingly, it is deemed that the output of the circuit (27) becomes unstable. Therefore, the controller (20) turns off the photo-MOS relay (30) (for a time period (T7)) from the time point (t5) after the elapse of a time (t4-t5) during which it is deemed that each of the components (20-29) can work stably after the power is shut off at the time point (t4). Thus, the output of the CPLT output circuit (27) is shut off, and thereby the communication with an electrically-powered car (100) through the CPLT output circuit (27) can be stopped for the transitional period during which the output becomes unstable.

In the present embodiment, the photo-MOS relay (30) is turned off for a time period during which the voltage level of a state signal from the CPLT output circuit (27) becomes unstable. Thereby, an unstable state signal is prevented from being transmitted to the side of an electrically-powered car (100), and accordingly a stable signal can be transmitted and received between the feed control device (1) and the car (100).

The time period (T6), during which the photo-MOS relay (30) is turned off, after power is activated, as well as the time period (T7), during which the relay (30) is turned off, after power is shut off are previously set to adequate time each according to a transient property of the circuit.

Fifth Embodiment

Figure 12:
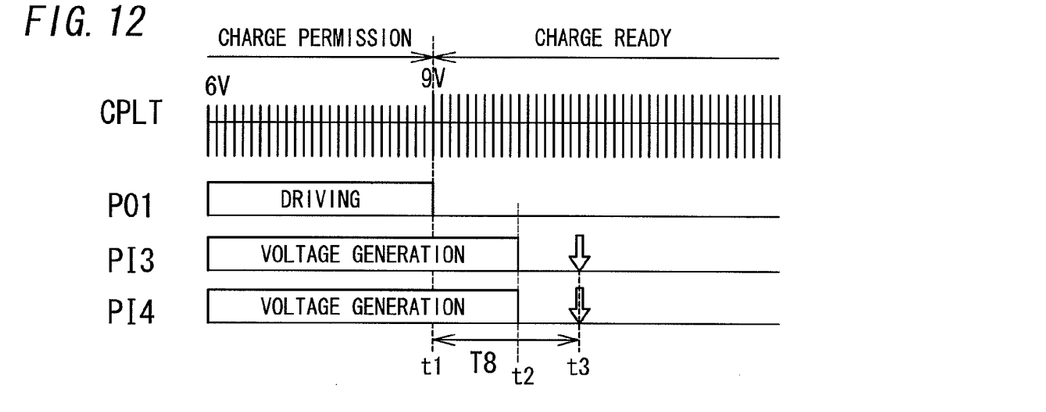
FIG. 12 is an operation timing chart of a fifth embodiment of the present invention, wherein CPLT shows a CPLT signal, PO1 is an output terminal of a controller and shows relay drive output, PI3 is an input terminal of the controller and shows a detection signal from a live voltage detector, and PI4 is an input terminal of the controller and shows a detection signal from a neutral voltage detector.
Figure 13:
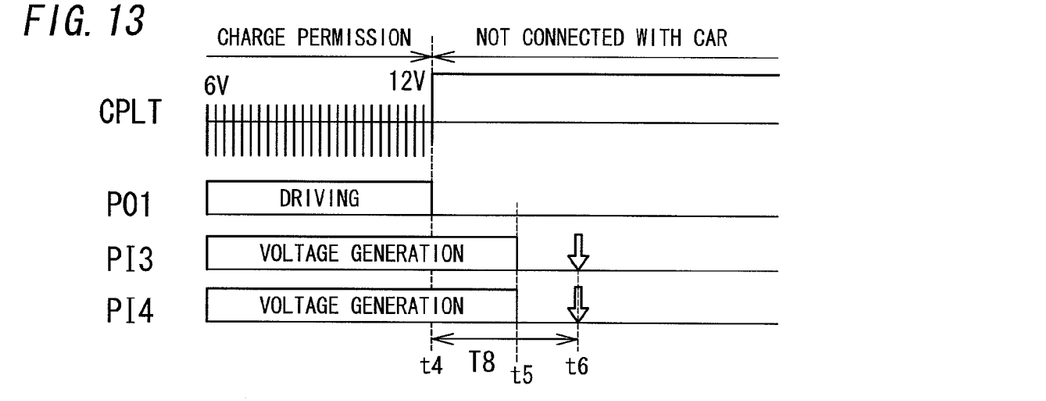
FIG. 13 is another operation timing chart of the embodiment, wherein CPLT shows a CPLT signal, PO1 is an output terminal of the controller and shows relay drive output, PI3 is an input terminal of the controller and shows a detection signal from the live voltage detector, and PI4 is an input terminal of the controller and shows a detection signal from the neutral voltage detector.

A fifth embodiment of the present invention is explained with reference to FIGS. 12 and 13.

A feed control device (1) of the present embodiment is configured to sense the presence of weld contacts in a relay (RY) after turning off the relay (RY) in response to charging completion of the battery (102) in an electrically-powered car (100). The embodiment is the same as any of the first to fourth embodiments except that the presence of weld contacts in the relay (RY) is sensed at a time point when the relay (RY) is turned off after the charging completion. Accordingly, like kind elements are assigned the same reference numerals as depicted in the embodiments and is not described in detail herein.

The operation of the embodiment is explained with reference to FIG. 12. If a state signal representing charge permission is entered into the input terminal (PI5) from the side of an electrically-powered car (100), a controller (20) of the feed control device (1) turns the relay (RY) on in accordance with the state signal to supply electric power to the car (100) side, thereby charging the battery (102) through the charge circuit (103) of the car (100). If charging of the battery (102) is completed, a state signal representing charge ready is entered into the device (1) from the controller (104) provided for the charge circuit (103) of the car (100) at a time point (t1), the controller (20) turns the relay (RY) off in accordance with the state signal representing charge ready entered through the CPLT input circuit (26). After the relay (RY) is turned off, each voltage level of detection signals of the live voltage detector (23) and the neutral voltage detector (24) is an H-level during discharge of the condensers (C3 and C13) in the detectors (23 and 24) (a time period from the time point (t1) to a time point (t2)). Accordingly, at a time point (t3) after the elapse of a predetermined time (T8) from the time point when the relay (RY) is turned off, the controller (20) receives detection signals of the live voltage detector (23) and the neutral voltage detector (24) and then compares each of the detection signals and a corresponding threshold signal about high and low. If each of the detection signals is lower than a corresponding threshold, the controller (20) decides that the relay (RY) is not welded. If at least one of the detection signals exceeds a corresponding threshold, the controller (20) decides that the relay (RY) is welded, because voltage generates at the secondary side of the relay (RY) regardless of trying to turn the relay (RY) off. The controller (20) then turns the error indicating lamp (LP2) on and also outputs a state signal representing error occurrence (−12V) through the CPLT output circuit (27). The aforementioned time (T8) is set to a sufficiently longer time than the time from the time point when the relay (RY) is turned off to the time point when the condensers (C3 and C13) of the live voltage detector (23) and the neutral voltage detector (24) are discharged and each of the detection signals is changed to an L-level.

If the vehicle side plug (CP) is detached during charging, the voltage level of a state signal entered into the CPLT input circuit (26) is changed from the voltage level (6V) during charge permission to the voltage level (12V) during non-connection with electrically-powered car (100). However, based on the state signal variation, the controller (20) senses the non-connection with car (100), and then turns the relay (RY) off. Thus, after turning the relay (RY) off, the controller (20) decides whether or not the relay (RY) is welded.

The operation is explained with reference to FIG. 13. If a state signal representing charge permission is entered into the input terminal (PI5) from the side of an electrically-powered car (100), the controller (20) of the feed control device (1) turns the relay (RY) on in accordance with the state signal to supply electric power to the car (100) side, thereby charging the battery (102) through the charge circuit (103) in the car (100). If the vehicle side plug (CP) is detached from the car (100) at a time point (t4) during charging, the voltage level of the state signal is changed from the voltage level (6V) during charge permission to the voltage level (12V) when no car (100) is connected. Accordingly, the controller (20) turns the relay (RY) off in accordance with the state signal representing that no car is connected, from the CPLT input circuit (26). After the relay (RY) is turned off, each voltage level of detection signals of the live voltage detector (23) and the neutral voltage detector (24) is an H-level during discharge of the condensers (C3 and C13) in the detectors (23 and 24) (a time period from the time point (t4) to a time point (t5)). Accordingly, at a time point (t6) after the elapse of a predetermined time (T8) from the time point when the relay (RY) is turned off, the controller (20) receives detection signals of the live voltage detector (23) and the neutral voltage detector (24) and then compares each of the detection signals and a corresponding threshold signal about high and low. If each of the detection signals is lower than a corresponding threshold, the controller (20) decides that the relay (RY) is not welded. If at least one of the detection signals exceeds a corresponding threshold, the controller (20) decides that the relay (RY) is welded, because voltage generates at the secondary side of the relay (RY) regardless of trying to turn the relay (RY) off. The controller (20) then turns the error indicating lamp (LP2) on and also outputs a state signal representing error occurrence (−12V) through the CPLT output circuit (27).

As discussed above, if the controller (20) of the device (1) receives a state signal representing charge ready or a state signal representing non-connection with car, from the controller (104) provided for the charge circuit (103), the controller (20) turns the relay (RY) off in accordance with any of the state signals and subsequently decides whether or not the relay (RY) is welded. Accordingly, it is possible to realize that the relay (RY) is successfully turned off when charging is completed or when the vehicle side plug (CP) is detached from the electrically-powered car (100), thereby improving safeness. If sensing that the relay (RY) is welded after charging is completed or when no car is connected, the controller (20) turns the error indicating lamp (LP2) on and also outputs a state signal representing error occurrence (−12V) through the CPLT output circuit (27). Accordingly, it is possible to notify a user of operation malfunction in the side of the feed control device (1) and also notify the car (100) side of the malfunction occurrence in the device (1).

Each feed control device (1) in the aforementioned embodiments is configured to check whether or not the operation as a leakage breaker is performed correctly through the relay (RY) by generating quasi-leakage through the quasi-leakage circuit (29) in response to operation of the test button (B1) by a user. However, not limited to this, the device (1) may perform operation for breaking leakage as a leakage breaker with self-checking function when charging is started. The self-checking function is explained with reference to FIG. 14.

Figure 14:
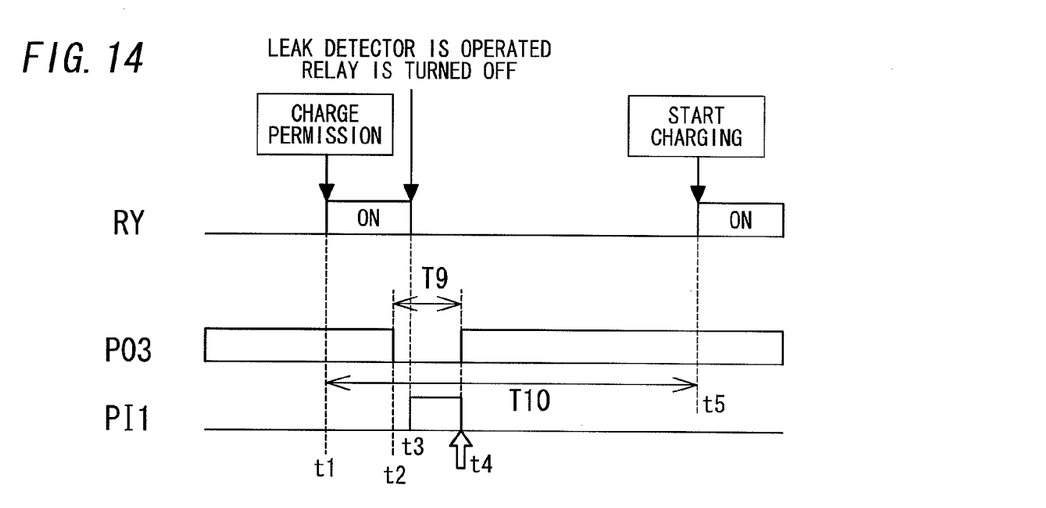
FIG. 14 is an operation timing chart of the embodiment, wherein RY shows on and off condition of a relay, PO3 is an output terminal of the controller and shows a self-leakage output, and PI1 is an input terminal of the controller and shows a detection signal from a leak detector.

When the power supply side plug (PP) is connected to a power receptacle and the vehicle side plug (CP) is connected to the connector (101) of an electrically-powered car (100), if a state signal representing charge permission is entered into the feed control device (1) from the car (100) at a time point (t1), the controller (20) supplies the relay driver (25) with a close control signal for turning on the relay (RY) to turn on the relay (RY) through the driver (25). If the controller (20) subsequently changes the output level of the output terminal (PO3) to an L-level at a time point (t2), the quasi-leakage circuit (29) generates quasi-leakage by short-circuiting between the electrically-conducting path (L1) corresponding to a live wire and the electrically-conducting path (L2) corresponding to a neutral wire by means of a predetermined resistor in accordance with self leakage output from the controller (20). In this instance, if (at a time point (t3)) the leak detector (22) detects the leakage to supply a leakage detection signal to the controller (20), the controller (20) turns the relay (RY) off. At a time point (t4) after the elapse of a predetermined time (T9) from the occurrence of the quasi-leakage, the controller (20) receives the detection signals of the live voltage detector (23) and the neutral voltage detector (24), and then decides whether or not the relay (RY) is successfully turned off. Herein, the time (T9) is a time necessary for the operation of the leak detector (22), and is set to, e.g., 100 milliseconds. If the relay (RY) is successfully turned off, the controller (20) starts charging by turning on the relay at a time point (t5) after the elapse of a predetermined mask time (T10). Thus, it is possible to start charging after checking that the leakage detecting function works correctly. At the time point (t4), if deciding that the relay (RY) is not turned off, the controller (20) turns the error indicating lamp (LP2) on and also outputs a state signal representing error occurrence (−12V) through the CPLT output circuit (27). Therefore, a user can be notified of operation malfunction in the function as a leakage breaker, and the car (100) side can be notified of failure occurrence in the feed control device (1).

Although the present invention has been described with reference to certain preferred embodiments, numerous modifications and variations can be made by those skilled in the art without departing from the true spirit and scope of this invention, namely claims.

The invention claimed is:

1. A feed control device, configured to control power feeding from an external power supply to an electrically-powered car comprising a battery and a charge circuit configured to charge the battery,
wherein the feed control device comprises:
a power connector configured to be detachably attached to a power receptacle of an external power supply;
a load connector configured to be detachably attached to a connector for receiving power, which an electrically-powered car is equipped with;
a contact device placed at a feed line for electrically connecting the power connector and the load connector;
a leak detector for detecting the occurrence of electrical leakage at the side of the electrically-powered car;
a signal input circuit for receiving, from the side of the charge circuit, a state signal representing an operating state by a voltage level;
a controller configured: to turn the contact device off when a state signal representing charge permission is not entered into the signal input circuit; to turn the contact device on when the state signal representing charge permission is entered into the signal input circuit; and to turn the contact device off when said occurrence of electrical leakage is detected;
a feed detector for detecting the presence of power feeding from the external power supply by detecting zero crossing of voltage generated at the feed line between the power connector and the contact device;
an output detector configured to detect the presence of power feeding into the side of the car based on voltage generated at the feed line between the contact device and the load connector;
a contact weld sensor configured to sense that the contact device is welded based on a detection result of the output detector if the feed detector detects said presence of power feeding when the state signal representing charge permission is not entered into the signal input circuit; and
an alarm device configured, if the contact weld sensor senses that the contact device is welded, to indicate the occurrence of weld to the outside.

2. The feed control device of claim 1, wherein the controller is configured, if the signal input circuit receives the state signal representing charge permission: to turn the contact device off for a predetermined time; to subsequently sense whether or not the contact device is welded through the contact weld sensor; and to turn the contact device on if the contact device is not welded.

3. The feed control device of claim 1,
wherein the output detector is configured to periodically detect the presence of power feeding while the controller turns the contact device on in accordance with the state signal representing charge permission,
wherein the feed control device further comprises a malfunction detector configured to detect operation malfunction of the contact device if said presence of power feeding is not detected through the output detector,
wherein the alarm device is configured, if the malfunction detector detects the operation malfunction, to indicate the occurrence of the operation malfunction of the contact device to the outside.

4. The feed control device of claim 1, further comprising:
an signal output circuit configured to supply the side of the charge circuit in the electrically-powered car with a state signal from the controller, said state signal representing an operating state by a voltage level, a photo-MOS relay connected between the signal output circuit and the load connector; and a relay controller configured to turn the photo-MOS relay off until the voltage level of a state signal supplied from the signal output circuit becomes stable.

5. The feed control device of claim 1, wherein the contact weld sensor is configured to sense that the contact device is welded if the output detector detects the presence of power feeding, after the controller turns the contact device off in accordance with the state signal.

* * * * *